(12) United States Patent
Anderson et al.

(10) Patent No.: US 10,943,911 B2
(45) Date of Patent: Mar. 9, 2021

(54) VERTICAL TRANSPORT DEVICES WITH GREATER DENSITY THROUGH MODIFIED WELL SHAPES

(71) Applicant: INTERNATIONAL BUSINESS MACHINES CORPORATION, Armonk, NY (US)

(72) Inventors: Brent A. Anderson, Jericho, VT (US); Stuart A. Sieg, Albany, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 143 days.

(21) Appl. No.: 15/955,283

(22) Filed: Apr. 17, 2018

(65) Prior Publication Data
US 2019/0319032 A1  Oct. 17, 2019

(51) Int. Cl.
| | | |
|---|---|---|
| *H01L 27/11* | (2006.01) | |
| *H01L 29/08* | (2006.01) | |
| *H01L 29/10* | (2006.01) | |
| *H01L 29/66* | (2006.01) | |
| *H01L 29/06* | (2006.01) | |
| *H01L 29/78* | (2006.01) | |

(Continued)

(52) U.S. Cl.
CPC .... *H01L 27/1104* (2013.01); *H01L 21/76224* (2013.01); *H01L 21/823814* (2013.01); *H01L 21/823878* (2013.01); *H01L 21/823885* (2013.01); *H01L 29/0649* (2013.01); *H01L 29/0847* (2013.01); *H01L 29/1037* (2013.01); *H01L 29/6656* (2013.01); *H01L 29/66666* (2013.01); *H01L 29/7827* (2013.01)

(58) Field of Classification Search
CPC ......... H01L 27/1104; H01L 21/823814; H01L 29/78618; H01L 29/0847; H01L 29/1037; H01L 29/66666; H01L 29/6656; H01L 29/0649; H01L 29/7827; H01L 21/823878; H01L 21/823885; H01L 21/76224; H01L 29/78642

See application file for complete search history.

(56) References Cited

U.S. PATENT DOCUMENTS

| | | | | |
|---|---|---|---|---|
| 5,394,358 A | * | 2/1995 | Huang ............... | H01L 27/1104 257/401 |
| 6,417,545 B1 | * | 7/2002 | Sakaguchi .......... | H01L 27/1104 257/368 |

(Continued)

OTHER PUBLICATIONS

Huynh-Bao et al., "Toward the 5nm Technology: Layout Optimization and Performance Benchmark for Logic/SRAMs Using Lateral and Vertical GAA FETs," Proceedings SPIE 9781, Design-Process-Technology Co-optimization or Manufacturability X. vol. 978102. Mar. 16, 2016. pp. 1-12.

*Primary Examiner* — Bac H Au
(74) *Attorney, Agent, or Firm* — Tutunjian & Bitetto, P.C.; Randall Bluestone

(57) ABSTRACT

In accordance with an embodiment of the present invention, a memory cell is provided. The memory cell includes a first L-shaped bottom source/drain including a first dopant, and a first adjoining bottom source/drain region abutting the first L-shaped bottom source/drain, wherein the first adjoining bottom source/drain region includes a second dopant that is the opposite type from the first dopant.

14 Claims, 13 Drawing Sheets

(51) Int. Cl.
*H01L 21/8238* (2006.01)
*H01L 21/762* (2006.01)

(56) References Cited

U.S. PATENT DOCUMENTS

| | | |
|---|---|---|
| 6,759,699 B1 | 7/2004 | Chi |
| 7,098,478 B2 | 8/2006 | Takaura et al. |
| 7,138,685 B2 | 11/2006 | Hsu et al. |
| 7,678,658 B2 | 3/2010 | Yang et al. |
| 8,179,711 B2 | 5/2012 | Kim et al. |
| 9,000,417 B1 | 4/2015 | Gogna et al. |
| 9,362,292 B1 | 6/2016 | Liaw |
| 9,620,509 B1 | 4/2017 | Pao et al. |
| 9,680,473 B1 | 6/2017 | Anderson et al. |
| 9,711,511 B1 | 7/2017 | Lim et al. |
| 9,721,957 B2 | 8/2017 | Nakanishi et al. |
| 2015/0318288 A1 | 11/2015 | Lim et al. |

\* cited by examiner

US 10,943,911 B2

VERTICAL TRANSPORT DEVICES WITH GREATER DENSITY THROUGH MODIFIED WELL SHAPES

BACKGROUND

Technical Field

The present invention generally relates to static random access memory (SRAM) cells occupying a reduced area on a substrate, and more particularly to modified bottom source/drain region configurations and dimensions that reduce the spacing between adjacent SRAM memory cells and overall area occupied by a plurality of SRAM cells.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

A static random access memory (SRAM) cell can include six (6) metal-oxide-semiconductor field effect transistors (MOSFETs), referred to as 6T. An SRAM cell can include a pull-up portion including PMOS transistors which can set an output to a digital '1' whenever the implemented function defines it, and a pull-down portion including NMOS transistors that can set the output to a digital '0' whenever the implemented function defines it. The SRAM cell can also include wordlines (WL) and bitlines (BL, $\overline{BL}$), where the wordlines and bitlines can be electrically connected to two of the six transistors acting as access transistors (i.e., pass gate (PG) transistors). In SRAM, a switching state is stored compared to an electric change in dynamic random access memory (DRAM). These devices occupy an area of a chip die, where a decrease is a device's footprint on the die can provide an increase in overall device density.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a memory cell is provided. The memory cell includes a first L-shaped bottom source/drain including a first dopant, and a first adjoining bottom source/drain region abutting the first L-shaped bottom source/drain, wherein the first adjoining bottom source/drain region includes a second dopant that is the opposite type from the first dopant.

In accordance with another embodiment of the present invention, a static random access memory (SRAM) cell is provided. The static random access memory (SRAM) cell includes a first L-shaped bottom source/drain including a p-type dopant, and a vertical fin on the first L-shaped bottom source/drain. The static random access memory (SRAM) cell further includes a first adjoining bottom source/drain region including an n-type dopant, and two vertical fins on the first adjoining bottom source/drain region. The static random access memory (SRAM) cell further includes a second L-shaped bottom source/drain electrically separated from the first L-shaped bottom source/drain by an isolation region fill, and a second adjoining bottom source/drain region abutting the second L-shaped bottom source/drain.

In accordance with yet another embodiment of the present invention, a method of forming a memory cell is provided. The method includes forming a plurality of vertical fins on a substrate. The method further includes forming a first masking layer on a subset of the plurality of fins, wherein a portion of the plurality of vertical fins is exposed between the first portion of the first masking layer and a second portion of the first masking layer. The method further includes forming a first bottom source/drain region below the exposed portion of vertical fins. The method further includes forming a second masking layer on the exposed portion of the plurality of vertical fins, and removing the first masking layer to expose the subset of the plurality of fins. The method further includes forming a second bottom source/drain region below the exposed subset of the plurality of vertical fins that abuts the first bottom source/drain region. The method further includes removing the second masking layer, and forming spacers on the plurality of vertical fins.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

A static random access memory (SRAM) cell can be designed to use a minimum transistor size and cell area to maximize memory density. Reductions in component size can increase susceptibility to process variation and feature size tolerances. Reductions in component size can also increase gate leakage and sub-threshold leakage. By reducing the footprint of the underlying bottom source/drain regions of vertical transport fin field effect transistors (VT FinFETs), smaller memory cells and higher memory density can be obtained without further reducing the fin and gate structure dimensions. Smaller VT FinFET SRAMs can, thereby, be formed.

Embodiments of the present invention relate to modifying the size, shape and configuration of bottom source/drain regions, where the bottom source/drain regions can be formed having L-shapes that allow nesting of adjacent transistor regions with concomitant decrease in memory cell area and greater integration density.

Embodiments of the present invention relate to vertical transport fin field effect transistors (VTFinFETs) configured and patterned to form SRAM devices with an offset bottom source/drain region. The region around the p-doped (or p-type) fin field effect transistor (PFinFET) and n-doped (or n-type) fin field effect transistor (NFinFET) can have a self-aligned portion and a patterned portion, which provides a shape that is the union of the self-aligned and patterned portions. The n-type bottom source/drain region and p-type bottom source/drain region can abut. The bottom source/drain region can be pulled back from the PFinFET edge.

Embodiments of the present invention relate to utilizing bottom source/drain region fabrication processes that would form rectangular bottom source/drain regions to instead form L-shaped bottom source/drain regions.

Exemplary applications/uses to which the present invention can be applied include, but are not limited to: high density memory devices (e.g., static random access memory (SRAM)) and SRAM memory components of central processing units (CPUs) or other processors and application specific integrated circuits (ASICs).

It is to be understood that aspects of the present invention will be described in terms of a given illustrative architecture; however, other architectures, structures, substrate materials and process features and steps can be varied within the scope of aspects of the present invention.

Figure 1:
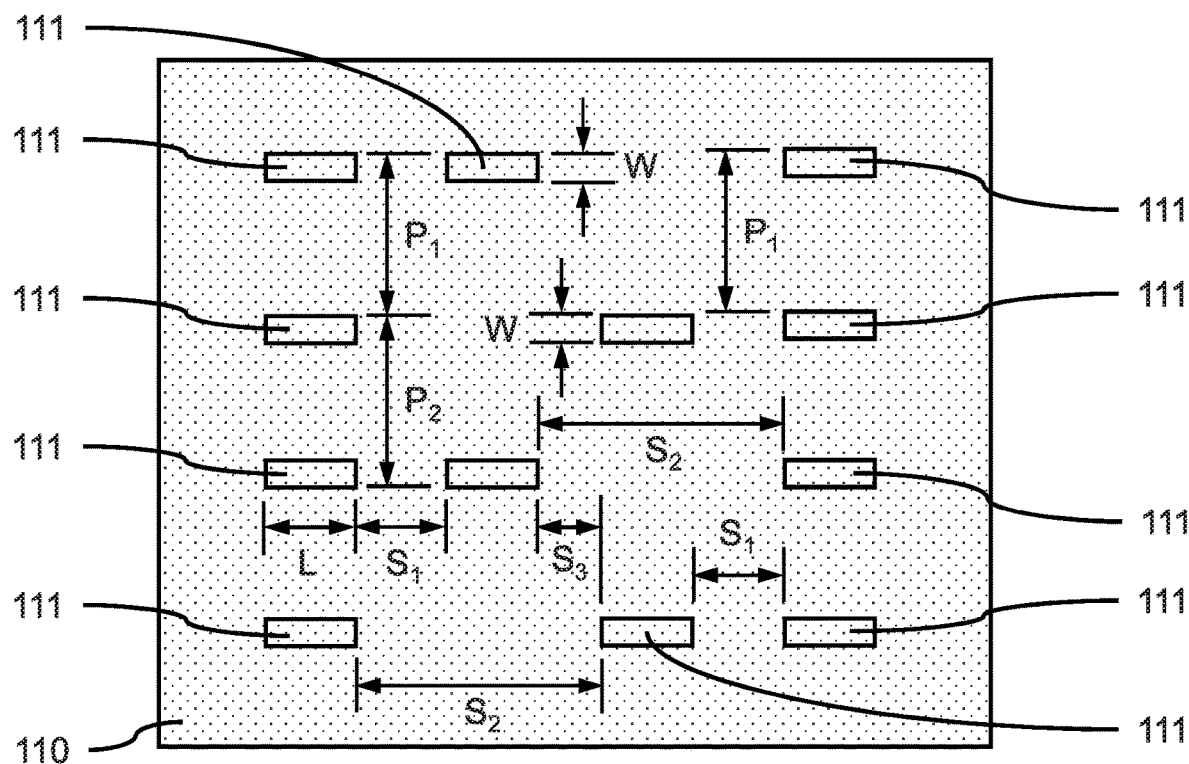
FIG. 1 is a top view showing a plurality of vertical fins formed on a substrate, in accordance with an embodiment of the present invention.

Referring now to the drawings in which like numerals represent the same or similar elements and initially to FIG. 1, a plurality of vertical fins formed on a substrate is shown, in accordance with an embodiment of the present invention.

A substrate 110 can be, for example, a single crystal semiconductor material wafer or a semiconductor-on-insulator stacked wafer. The substrate 110 can include a support layer that provides structural support, and an active semiconductor layer that can form devices. An insulating layer may be between the active semiconductor layer and the support layer to form a semiconductor-on-insulator substrate (SeOI) (e.g., a silicon-on-insulator substrate (SOI)). In various embodiments, the substrate 110 can be a single crystal silicon wafer.

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The active semiconductor layer can be a crystalline semiconductor, for example, a IV or IV-IV semiconductor (e.g., silicon (Si), silicon carbide (SiC), silicon-germanium (SiGe), germanium (Ge)), or a III-V semiconductor (e.g., gallium-arsenide (GaAs), indium-phosphide (InP), indium-antimonide (InSb)). In various embodiments, the semiconductor layer can be single crystal silicon.

The insulating layer can be, for example, a buried oxide (BOX) layer (e.g., $SiO_2$) or an implanted layer forming a buried insulating material.

In one or more embodiments, a plurality of vertical fins 111 can be formed on a substrate 110, wherein the vertical fin extend away from an exposed surface of the substrate. The vertical fins and substrate can be formed from a semiconductor material, where the vertical fins can be the same material as the substrate or a different semiconductor material from the substrate. The vertical fins can be etched from the substrate or a semiconductor layer on the substrate, or grown on the substrate.

In one or more embodiments, the plurality of vertical fins 111 can be formed on the substrate 110, where the vertical fins can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins may be formed by a direct write process or double patterning process using, for example, immersion lithography, extreme ultraviolet lithography, or x-ray lithography.

The plurality of vertical fins 111 can be configured and laid out on the substrate in a pattern to form a SRAM, where the vertical fins 111 can be further processed to form n-type vertical transport fin field effect transistors (NFinFETs) and p-type vertical transport fin field effect transistors (PFinFETs). The NFinFETs can form pull down (PD) transistors and pass gate (PG) transistors of the SRAM, and the PFinFETs can form pull up (PU) transistors.

The plurality of vertical fins 111 can be arranged on the substrate 110 to have predetermined pitches, $P_1$, $P_2$, and spacings, $S_1$, $S_2$, $S_3$, to allow gate structures, source/drain region contacts, and gate contacts to be formed to the respective PU, PD, and PG transistors. The pitch can be a center-to-center distance between a laterally adjacent pair of vertical fins, and the spacing can be the end wall-to-end wall distance between an adjacent pair of vertical fins 111. The plurality of vertical fins 111 can be arranged as a square or rectangular array on the substrate 110.

In various embodiments, the plurality of vertical fins 111 can have a width, W, in the range of about 4 nm to about 15 nm, or in the range of about 5 nm to about 10 nm, although other widths are also contemplated.

Figure 2:
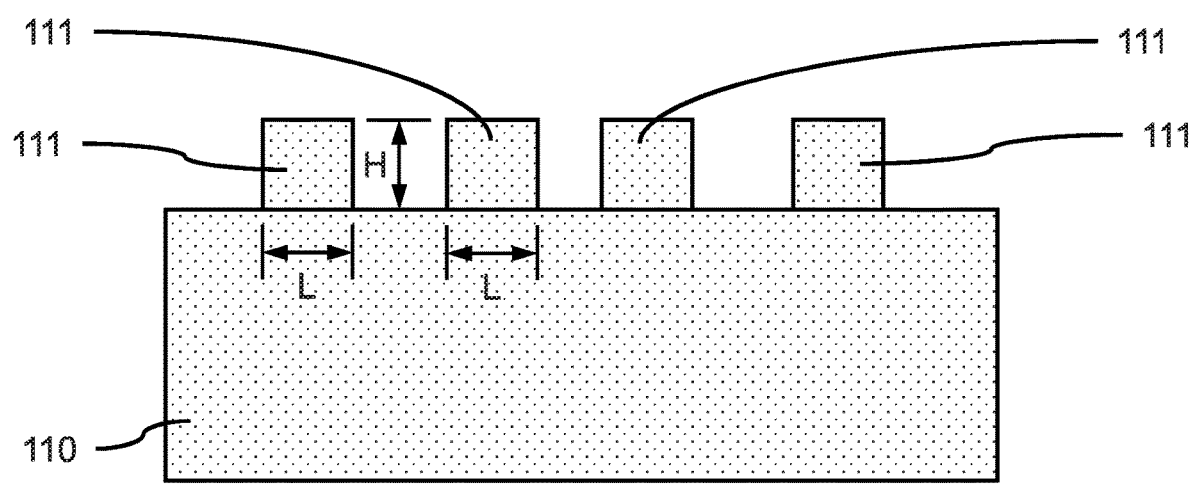
FIG. 2 is a side view showing a plurality of vertical fins formed on the substrate, in accordance with an embodiment of the present invention.

FIG. 2 is a side view showing a plurality of vertical fins formed on the substrate, in accordance with an embodiment of the present invention.

In various embodiments, the plurality of vertical fins 111 can have a length, L, in the range of about 5 nm to about 150 nm, or in the range of about 15 nm to about 70 nm, although other lengths are also contemplated.

In various embodiments, the plurality of vertical fins 111 can have a height, H, in the range of about 25 nm to about 100 nm, or in the range of about 30 nm to about 60 nm, although other heights are also contemplated.

Figure 3:
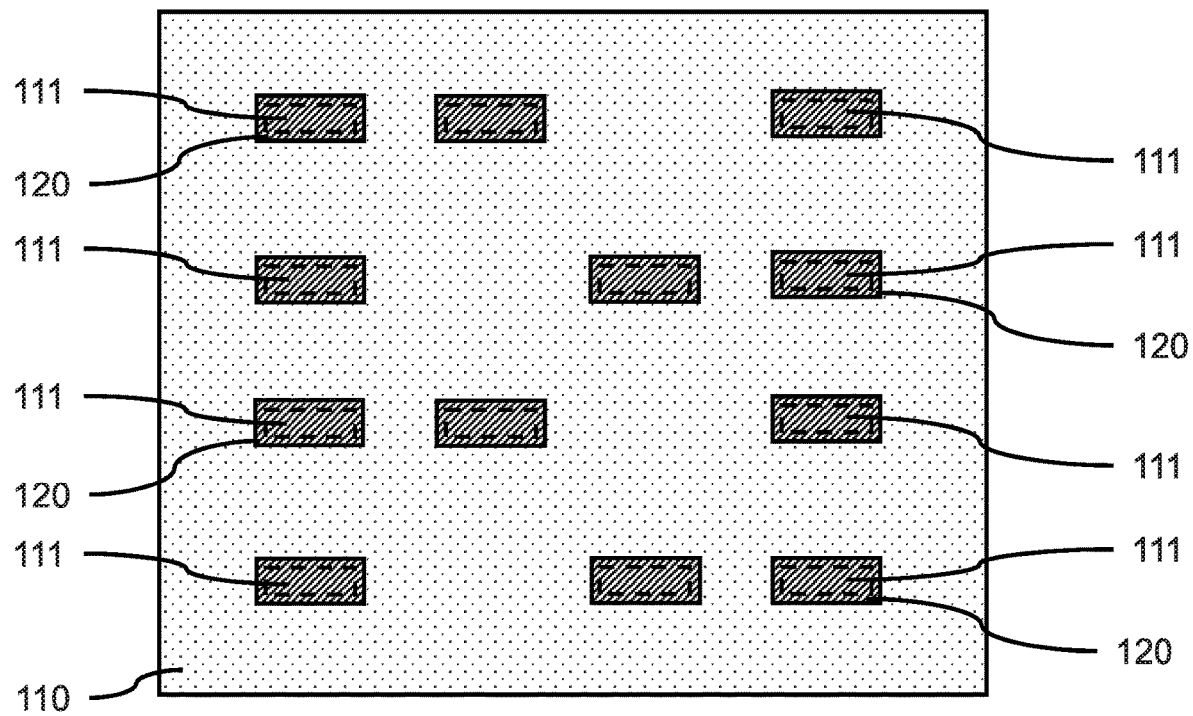
FIG. 3 is a top view showing a cover layer formed on each of the plurality of vertical fins on the substrate, in accordance with an embodiment of the present invention.

FIG. 3 is a top view showing a cover layer formed on each of the plurality of vertical fins on the substrate, in accordance with an embodiment of the present invention.

In one or more embodiments, a cover layer 120 can be formed on the plurality of vertical fins 111, where the cover layer 120 can be formed by a conformal deposition (e.g., atomic layer deposition (ALD), plasma enhanced ALD (PEALD), chemical vapor deposition (CVD), plasma enhanced CVD (PECVD), or a combination thereof. The cover layer 120 can be formed on the top surface, sidewalls, and end walls of each vertical fin 111. The thickness of the cover layer 120 on the surfaces of the vertical fins 111 can be controlled to form a layer sufficiently thick to prevent doping of the vertical fins 111 during subsequent implantation processes. In various embodiments, a portion of the cover layer 120 can be removed from the surface of the substrate 110 by etching to expose the areas between the vertical fins 111 and remaining cover layer 120. The vertical fins 111 hidden by the cover layer 120 are shown as dashed lines.

The cover layer 120 can be any suitable material, including but not limited to a dielectric oxide (e.g., silicon oxide (SiO), carbon-doped silicon oxide (SiO:C)), or a dielectric nitride (e.g., silicon nitride (SiN), silicon boronitride (SiBN), silicon borocarbonitride (SiBCN), silicon oxyboronitride (SiOBN), silicon oxycarbonitride (SiOCN)), or combinations thereof.

Figure 4:
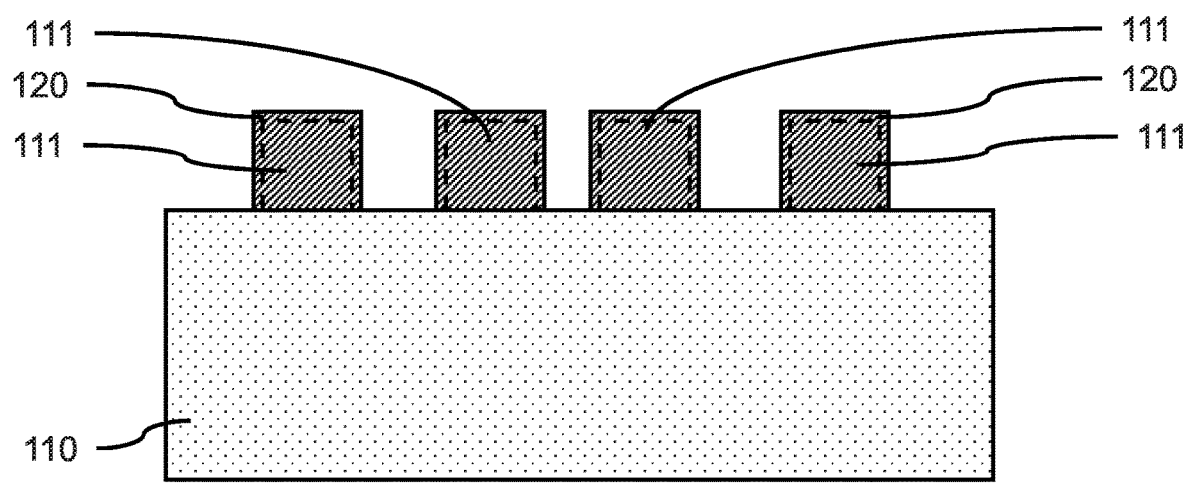
FIG. 4 is a side view showing a cover layer on each of a plurality of vertical fins in accordance with an embodiment of the present invention.

FIG. 4 is a side view showing a cover layer on each of a plurality of vertical fins in accordance with an embodiment of the present invention.

In one or more embodiments, a portion of the cover layer 120 can remain on each of the plurality of vertical fins 111, and the area of the substrate around the vertical fins can be exposed. The vertical fins 111 can have different distances to immediately adjacent vertical fins. The vertical fins 111 hidden by the cover layer 120 are shown as dashed lines.

Figure 5:
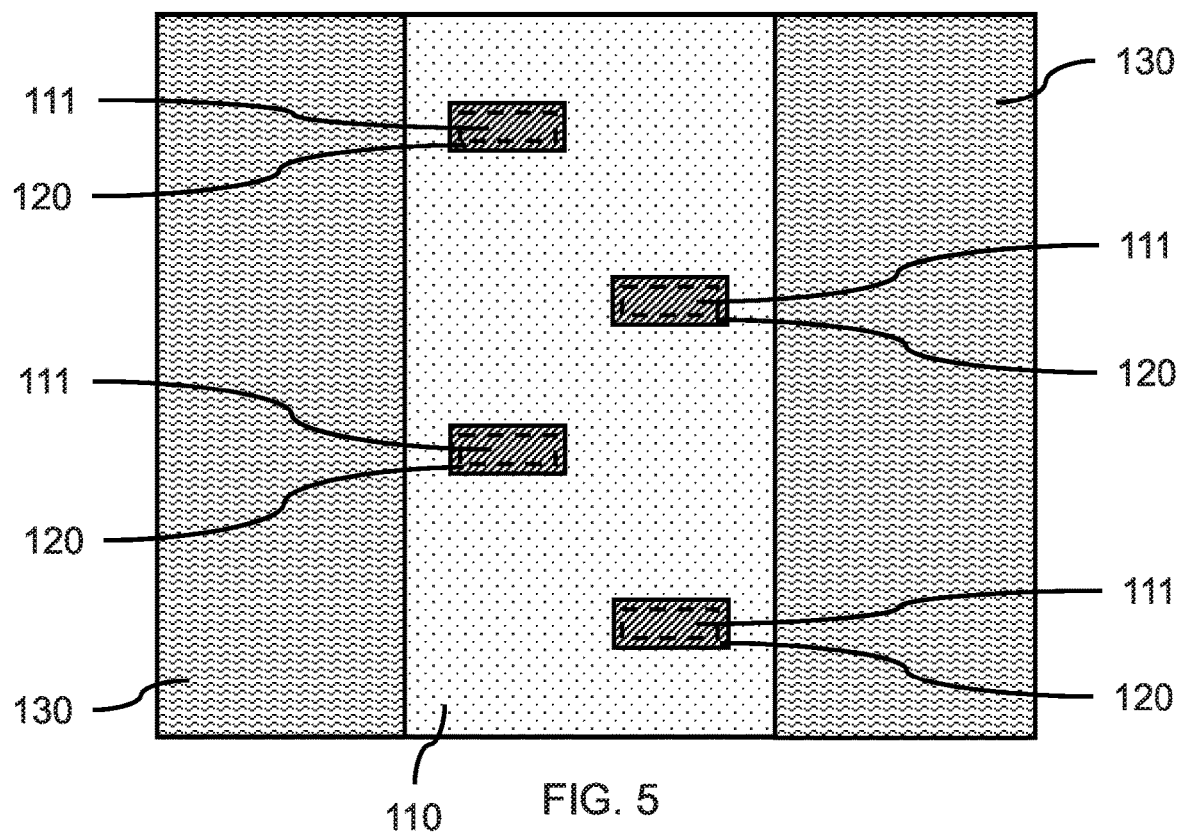
FIG. 5 is a top view showing a first masking layer on opposite sides of a plurality of covered vertical fins, in accordance with an embodiment of the present invention.

FIG. 5 is a top view showing a first masking layer on opposite sides of a plurality of covered vertical fins, in accordance with an embodiment of the present invention.

In one or more embodiments, a first masking layer 130 can be formed on the cover layer 120, vertical fins 111, and substrate 110, where the first masking layer 130 can be formed by a blanket deposition (e,g, chemical vapor deposition (CVD), physical vapor deposition (PVD), spin-on, etc.).

In one or more embodiments, a first masking layer 130 can be a soft mask material, for example, a lithography resist material, such as a polymeric material (e.g. poly(methyl methacrylate) (PMMA), siloxanes, polydimethylsiloxane (PDMS), hydrogen silsesquioxane (HSQ), tetraethyl orthosilicate (TEOS), etc.) or amorphous carbon (a-C).

In various embodiments, the first masking layer 130 can be hardmask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. The first masking layer 130 can also be a combination of a hardmask and soft mask.

In one or more embodiments, a first masking layer 130 can be patterned using lithographic techniques and etching to remove a portion of the first masking layer 130 on a predetermined set of adjacent vertical fins. The removed portion of the first masking layer 130 can be a strip of material that can expose a staggered (e.g., zig-zag) pattern of vertical fins 111, while leaving portions of the first masking layer 130 on opposite sides of the cover layer 120 covered vertical fins 111. The vertical fins under the remaining portions of the first masking layer 130 can be laterally adjacent vertical fins 111 arranged in columns.

Figure 6:
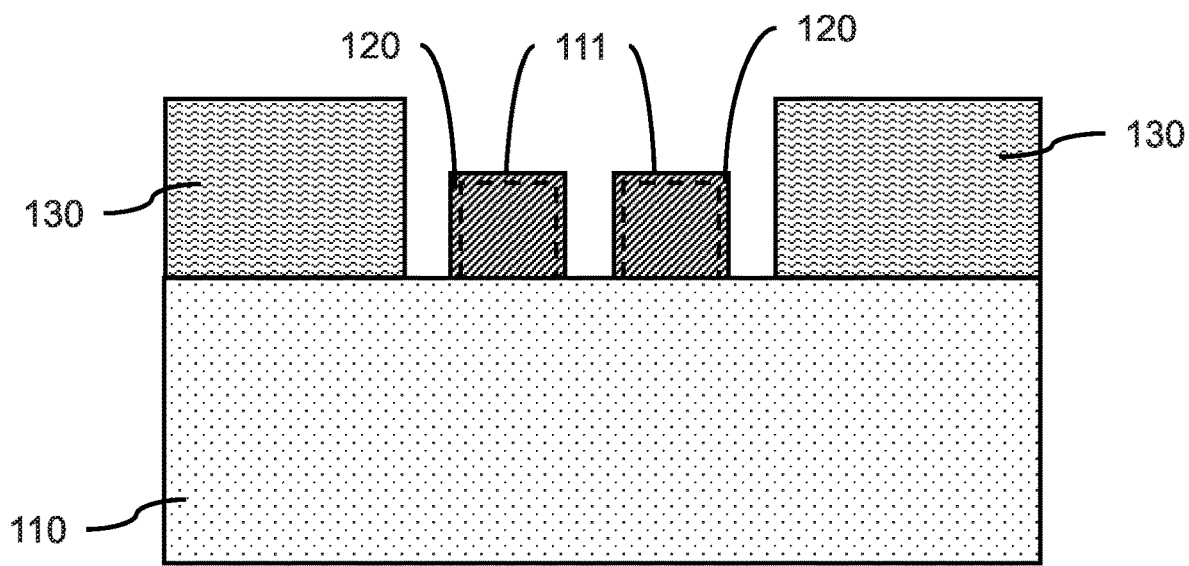
FIG. 6 is a side view showing a first masking layer on opposite sides of a plurality of staggered vertical fins, in accordance with an embodiment of the present invention.

FIG. 6 is a side view showing a first masking layer on opposite sides of a plurality of staggered vertical fins, in accordance with an embodiment of the present invention.

In various embodiments, removal of the strip portion of the first masking layer 130 can expose a portion of the substrate between and around the staggered vertical fins 111.

Figure 7:
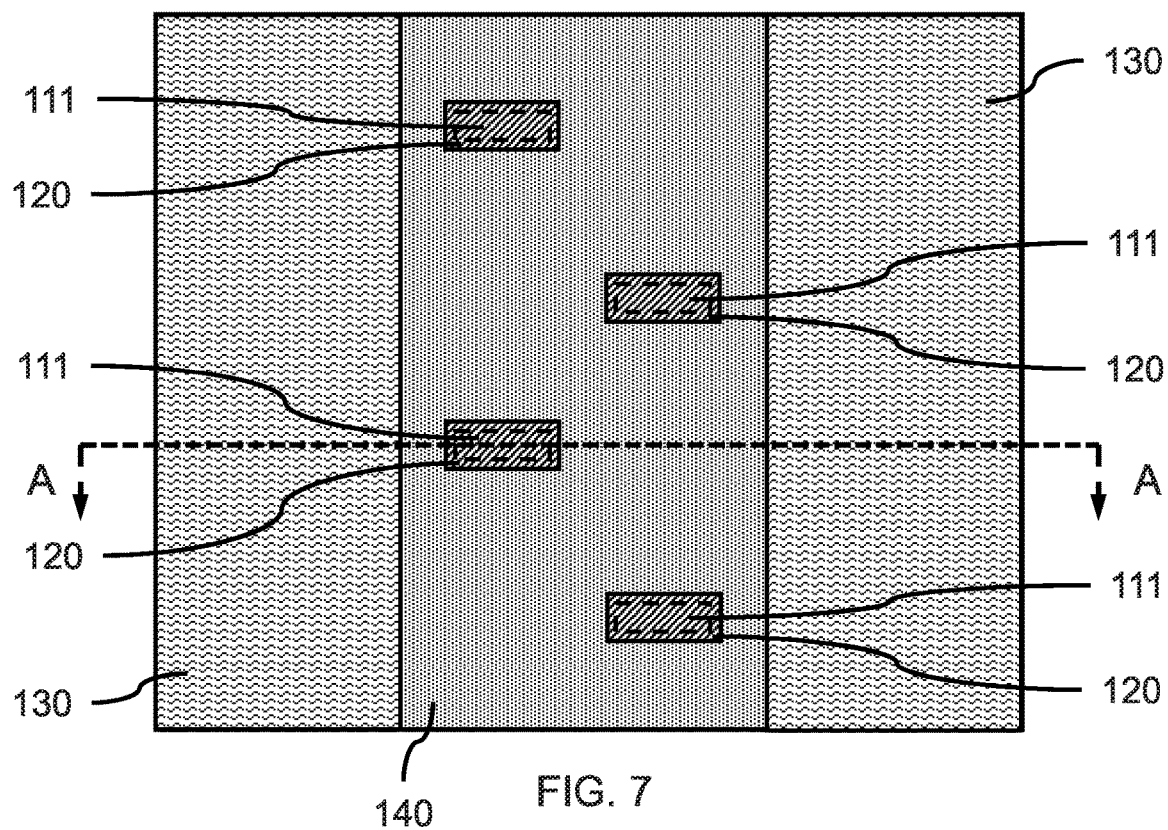
FIG. 7 is a top view showing a first bottom source/drain region formed in the exposed region of the substrate with the plurality of covered vertical fins, in accordance with an embodiment of the present invention.

FIG. 7 is a top view showing a first bottom source/drain region formed in the exposed region of the substrate with the plurality of covered vertical fins, in accordance with an embodiment of the present invention.

In one or more embodiments, a first bottom source/drain region 140 can be formed in the exposed portion of the substrate 110. In various embodiments, the first bottom source/drain region 140 can be formed by suitable doping techniques, including but not limited to, ion implantation, gas phase doping, plasma doping, plasma immersion ion implantation, cluster doping, infusion doping, liquid phase doping, solid phase doping, etc. The first bottom source/drain region 140 can also be formed by expitaxial growth of a doped layer with in-situ doping (where doping and epitaxy growth are performed at the same time), and/or ex-situ doping (where doping occurs before and/or after epitaxy). In various embodiments, the first bottom source/drain region 140 can be self-aligned to the predetermined vertical fins 111 by exposing the cover layer 120 covered vertical fins 111, and implanting the predetermined dopant type to form the PU transistors.

The cover layer 120 can protect the exposed vertical fins 111 from implantation and implantation damage, where the cover layer 120 can be sufficiently thick to prevent the introduction of dopants into the vertical fins.

In various embodiments, the first bottom source/drain region 140 can be doped to form n-type or p-type source/drains to fabricate NFETs or PFETs. In various embodiments, phosphorus doped silicon (Si) can be used as the bottom source/drain for NFETs and boron doped silicon (Si) or silicon-germanium (SiGe) can be used as the bottom source/drain for PFETs.

In various embodiments, the first bottom source/drain region 140 can be a common p-type bottom source/drain region 140 for forming pull-up transistors for an SRAM, where the first bottom source/drain region 140 can be subdivided to form separate bottom source/drains for each pull-up (PU) transistor. Formation of a common bottom source/drain region for the staggered vertical fins on the same region can allow a reduction in overall area used to form the bottom source/drains by reducing the linear distance between vertical fins, while maintaining a sufficient oblique distance to avoid shorting of conductive elements and/or interference between formation of separate structures.

Figure 8:
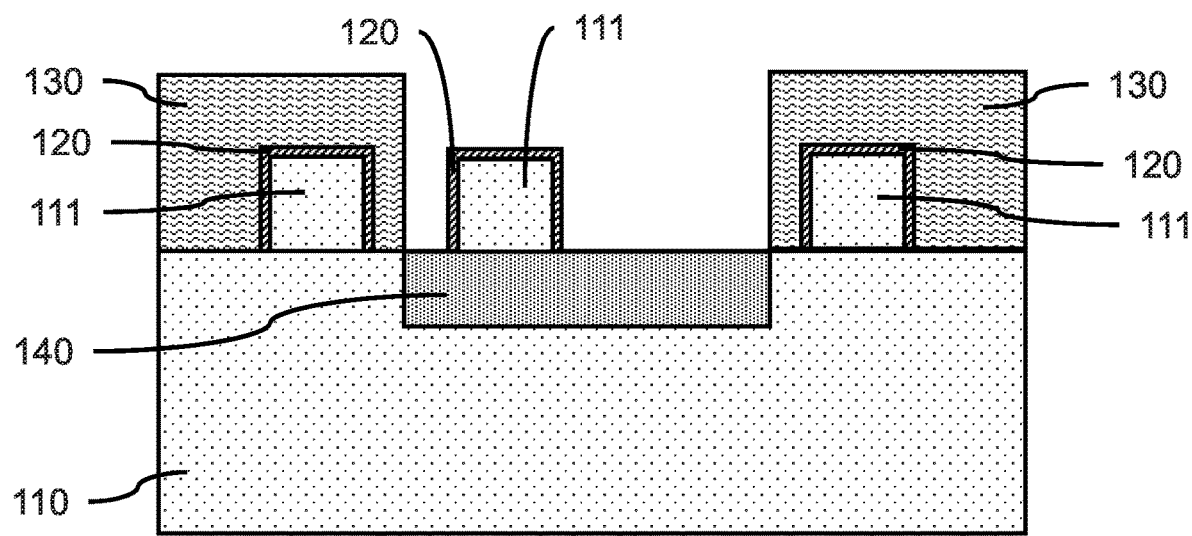
FIG. 8 is a cross-sectional side view of the A-A section of FIG. 7 showing a first bottom source/drain region formed in the exposed region of the substrate and a covered vertical fin on the first bottom source/drain region, in accordance with an embodiment of the present invention.

FIG. 8 is a cross-sectional side view of the A-A section of FIG. 7 showing a first bottom source/drain region formed in the exposed region of the substrate and a covered vertical fin on the first bottom source/drain region, in accordance with an embodiment of the present invention.

In various embodiments, the first bottom source/drain region 140 can be formed to a depth of about 20 nm to about 50 nm, or about 30 nm to about 40 nm, although other depths are contemplated.

The first bottom source/drain region 140 can be doped to form n-type or p-type source/drains to fabricate PFinFETs or NFinFETs. In various embodiments, ex-situ phosphorus doped silicon can be used as the bottom source/drain region for NFinFETs and ex-situ boron doped silicon can be used as the bottom source/drain region for PFinFETs.

In various embodiments, the first bottom source/drain region 140 can have a length parallel with the long axis of the vertical fins 111 in the range of about 15 nm to about 300 nm, or in the range of about 25 nm to about 150 nm, or about 50 nm to about 100 nm, although other lengths are also contemplated. The length of the first bottom source/drain legion can be greater than the length of the overlying vertical fin 111 or combination of two staggered fins in different columns.

Figure 9:
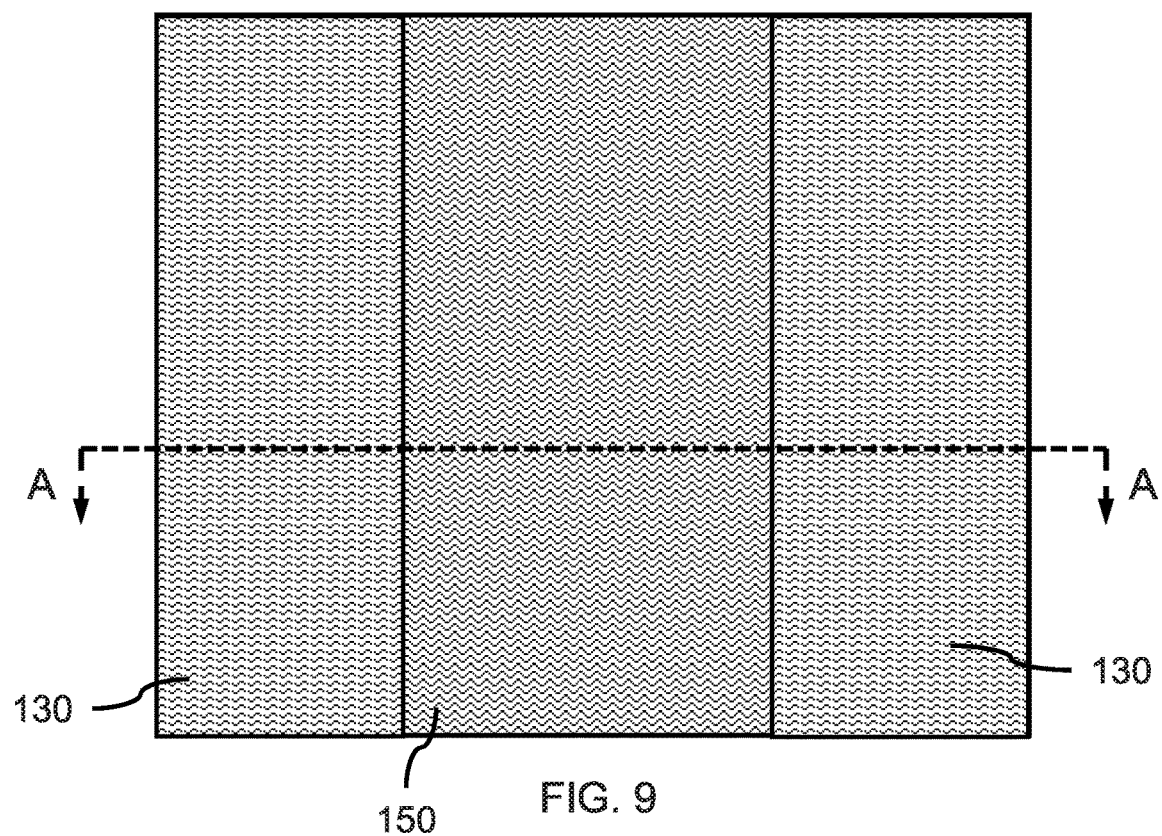
FIG. 9 is a top view showing a second masking layer formed in the opening between the remaining strips of the first masking layer, in accordance with an embodiment of the present invention.

FIG. 9 is a top view showing a second masking layer formed in the opening between the remaining strips of the first masking layer, in accordance with an embodiment of the present invention.

In one or more embodiments, a second masking layer 150 can fill in the opening created by removing the portion of the first masking layer 130 on the predetermined set of adjacent vertical fins 111. The second masking layer 150 can be formed by a blanket deposition, and a chemical-mechanical polishing (CMP) can be used to remove excess material of the second masking layer 150 above the top surface of the first masking layer 130 to provide a smooth, flat surface. The second masking layer 150 can cover the vertical fins on the first source/drain region 140, and abutting the sidewalls of the remaining strips of the first masking layer 130.

In one or more embodiments, a second masking layer 150 can be a soft mask material, for example, a lithography resist material, such as a polymeric material (e.g. poly(methyl methacrylate) (PMMA), siloxanes, polydimethylsiloxane (PDMS), hydrogen silsesquioxane (HSQ), tetraethyl orthosilicate (TEOS), etc.) or amorphous carbon (a-C).

In various embodiments, the second masking layer 150 can be hardmask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. The second masking layer 150 can also be a combination of a hardmask and soft mask. The material of the second masking layer 150 can be different from the material of the first masking layer 130.

Figure 10:
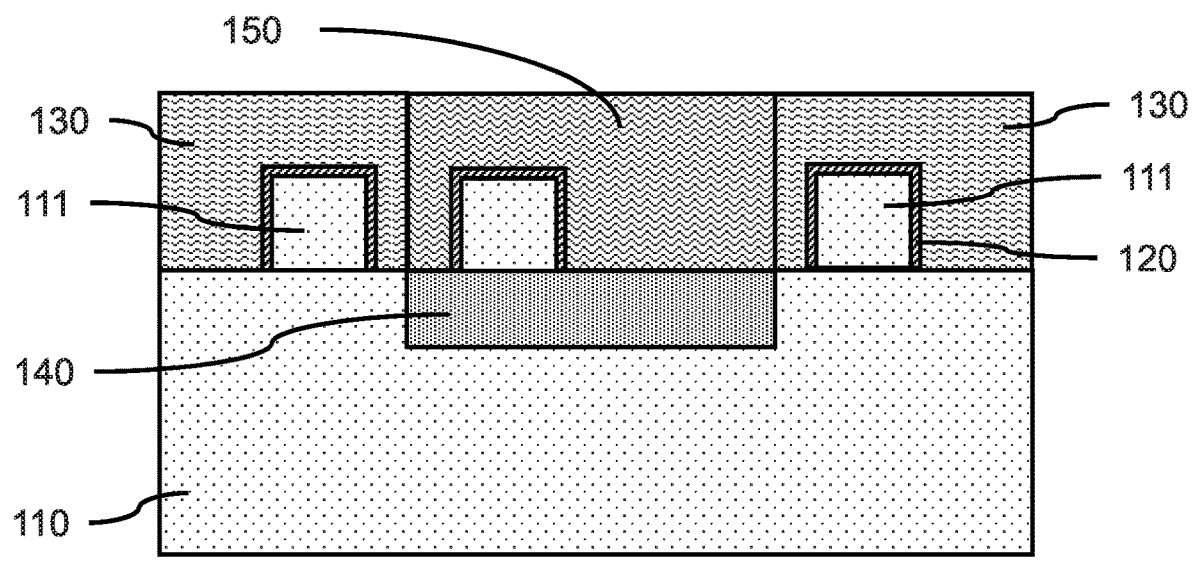
FIG. 10 is a cross-sectional side view of the A-A section of FIG. 9 showing the second masking layer covering the vertical fins between the portions of the first masking layer, in accordance with an embodiment of the present invention.

FIG. 10 is a cross-sectional side view of the A-A section of FIG. 9 showing the second masking layer covering the vertical fins between the portions of the first masking layer, in accordance with an embodiment of the present invention.

In one or more embodiments, the second masking layer can cover the first source/drain region 140 and staggered vertical fins 111 between the portions of the first masking layer 130. The sidewalls of the second masking layer 150 can have a common interface with a sidewall of the first masking layer 130, so the second masking layer 150 can be coextensive with the edges of the first source/drain region 140.

Figure 11:
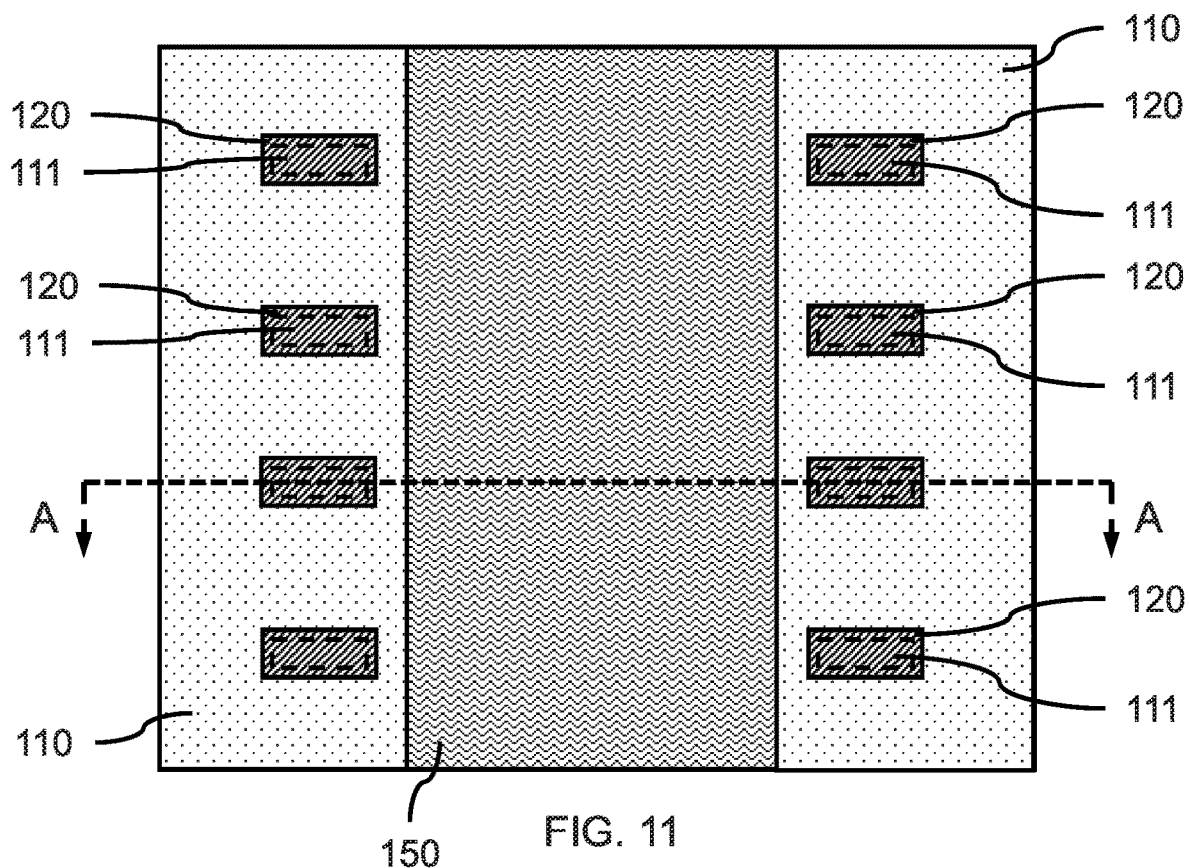
FIG. 11 is a top view showing a second masking layer on the doped first bottom source/drain region, and exposed adjacent regions of the substrate, in accordance with an embodiment of the present invention.

FIG. 11 is a top view showing a second masking layer on the first bottom source/drain region, and exposed adjacent regions of the substrate, in accordance with an embodiment of the present invention.

In one or more embodiments, the remaining portions of the first masking layer 130 can be removed to expose the underlying portions of the substrate 110. The first masking layer 130 can be removed using a selective etching process, for example, an isotropic wet or dry etch (e.g., wet chemical etch, dry plasma etch), a directional etch (e.g., a reactive ion etch (RIE), or a combination thereof. Removal of the first masking layer 130 can leave the second masking layer 150 covering the first bottom source/drain region 140, while the undoped region of the substrate is exposed. The material of the first masking layer 130 can be different from the material of the second masking layer 150 so the first masking layer 130 can be selectively removed.

Figure 12:
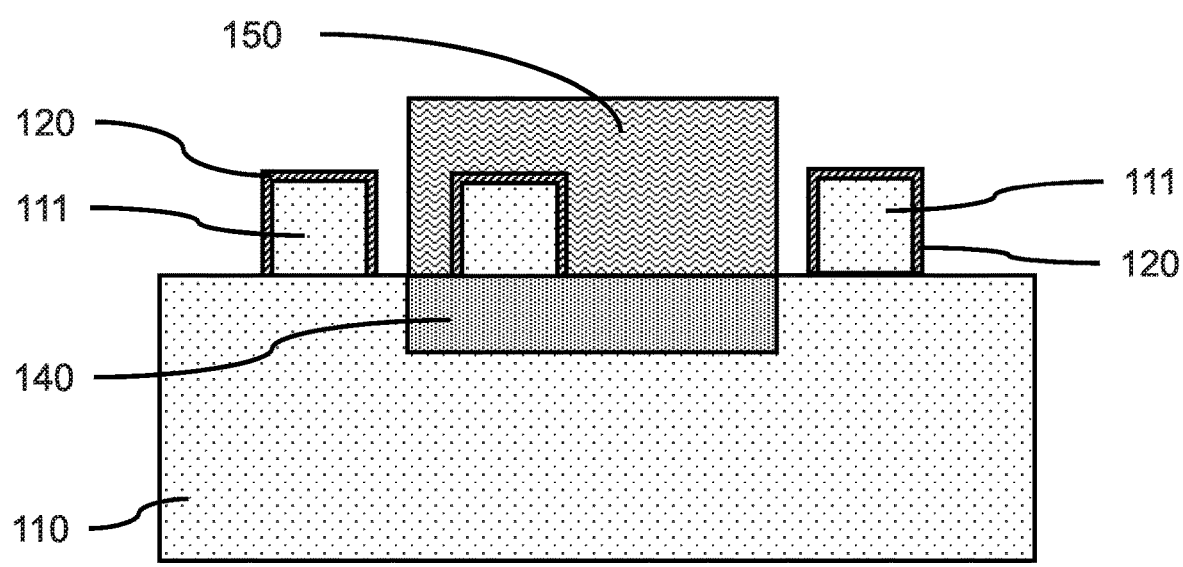
FIG. 12 is a cross-sectional side view of the A-A section of FIG. 11 showing the second masking layer on the covered vertical fins on the first bottom source/drain region and exposed vertical fins and regions of the substrate, in accordance with an embodiment of the present invention.

FIG. 12 is a cross-sectional side view of the A-A section of FIG. 11 showing the second masking layer on the covered vertical fins on the first bottom source/drain region and exposed vertical fins and regions of the substrate, in accordance with an embodiment of the present invention.

In one or more embodiments, the laterally adjacent vertical fins 111 can be exposed by removing the first masking layer 130, where the vertical fins are covered by the cover layer 120.

Figure 13:
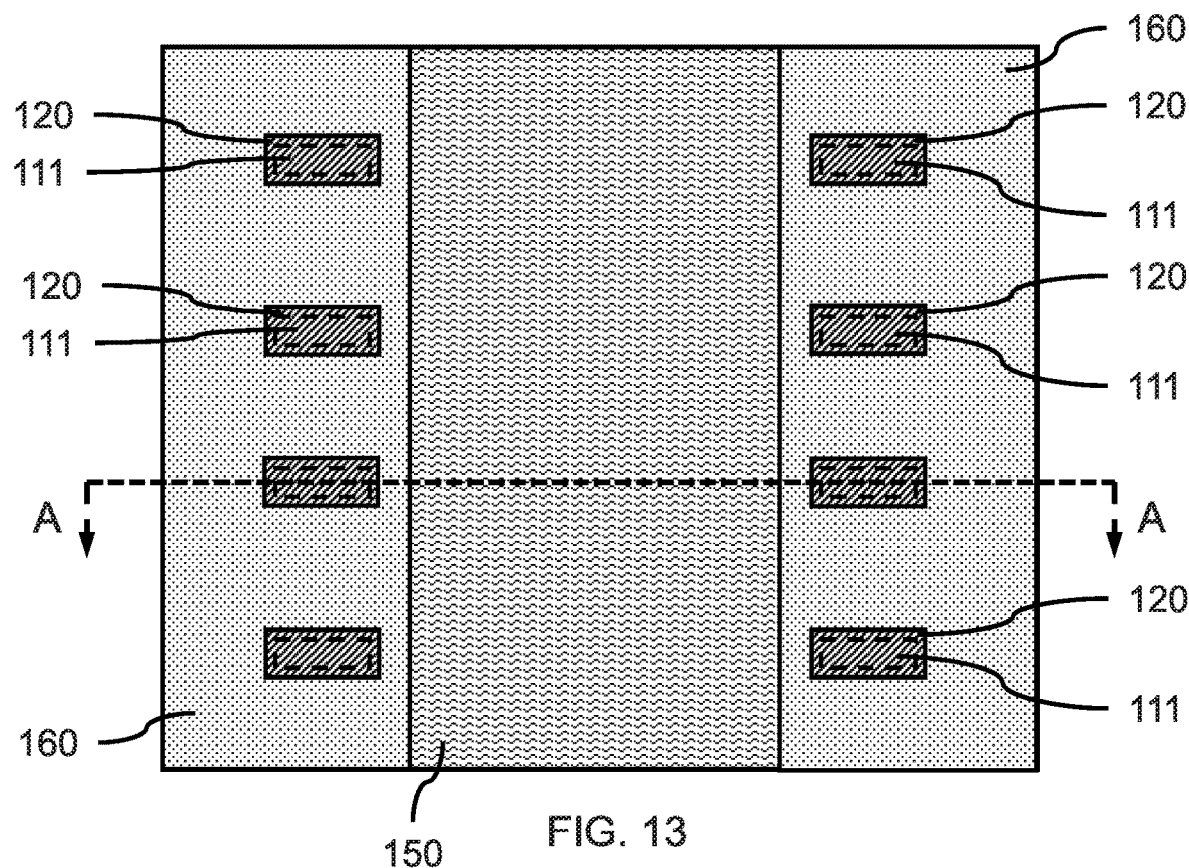
FIG. 13 is a top view showing second bottom source/drain regions formed in the substrate adjacent to the first bottom source/drain region, in accordance with an embodiment of the present invention.

FIG. 13 is a top view showing second bottom source/drain regions formed in the substrate adjacent to the first bottom source/drain region, in accordance with an embodiment of the present invention.

In one or more embodiments, a second bottom source/drain region 160 can be formed in the exposed portion of the substrate 110. In various embodiments, the second bottom source/drain region 160 can be formed by suitable doping techniques, including but not limited to, ion implantation, gas phase doping, plasma doping, plasma immersion ion implantation, cluster doping, infusion doping, liquid phase doping, solid phase doping, etc. The second bottom source/drain region 160 can also be formed by expitaxial growth of a doped layer with in-situ doping (where doping and epitaxy growth are performed at the same time), and/or ex-situ doping (where doping occurs before and/or after epitaxy). In various embodiments, the second bottom source/drain region 160 can be self-aligned to the predetermined vertical fins 111 by exposing the cover layer 120 covered vertical fins 111, and implanting the predetermined dopant type to form the PD and PG transistors.

In various embodiments, the second bottom source/drain region 160 can be doped to form n-type or p-type source/drains to fabricate NFETs or PFETs. In various embodiments, phosphorus doped silicon (Si) can be used as the bottom source/drain for NFETs and boron doped silicon (Si) or silicon-germanium (SiGe) can be used as the bottom source/drain for PFETs.

In various embodiments, the second bottom source/drain region 160 can be a common n-type bottom source/drain region 160 for forming pull-down (PD) transistors and pass gate (PG) transistors for an SRAM, where the second bottom source/drain region 160 can form the bottom source/drain for the pull-down transistor and pass gate (PG) transistor.

Figure 14:
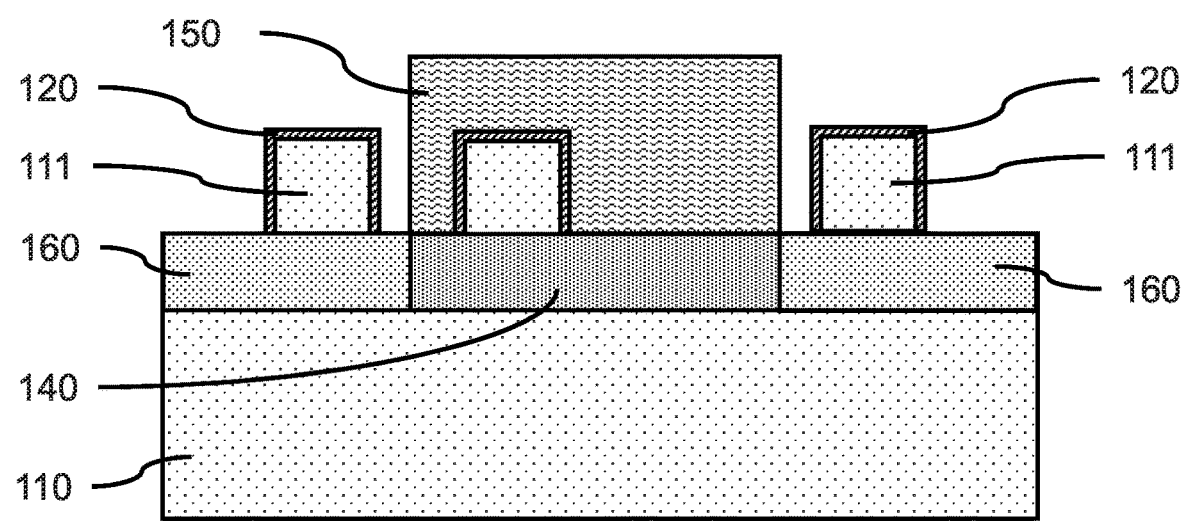
FIG. 14 is a cross-sectional side view of the A-A section of FIG. 13 showing second bottom source/drain regions formed in the substrate adjacent to the first bottom source/drain region, in accordance with an embodiment of the present invention.

FIG. 14 is a cross-sectional side view of the A-A section of FIG. 13 showing second bottom source/drain regions formed in the substrate adjacent to the first bottom source/drain region, in accordance with an embodiment of the present invention.

In one or more embodiments, the second bottom source/drain regions 160 can adjoin the first bottom source/drain region 140, where the second bottom source/drain regions 160 can be self-aligned with the first bottom source/drain region 140. There may be some overlap of the n-type doped region and the p-type doped region at the interface.

Figure 15:
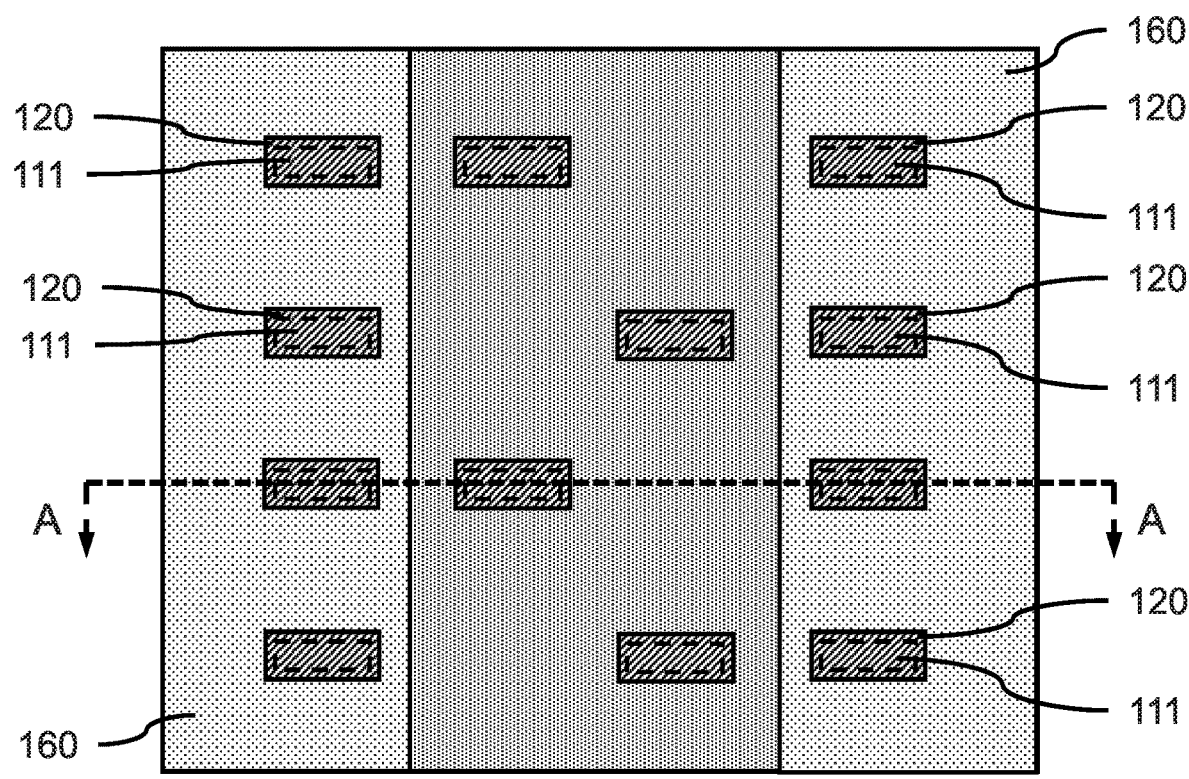
FIG. 15 is a top view showing a first set of covered vertical fins on the first bottom source/drain region and a second set of covered vertical fins on the second bottom source/drain regions, in accordance with an embodiment of the present invention.

FIG. 15 is a top view showing a first set of covered vertical fins on the first bottom source/drain region and a second set of covered vertical fins on the second bottom source/drain regions, in accordance with an embodiment of the present invention.

In one or more embodiments, the second masking layer 150 can be removed to expose the first bottom source/drain region 140.

Figure 16:
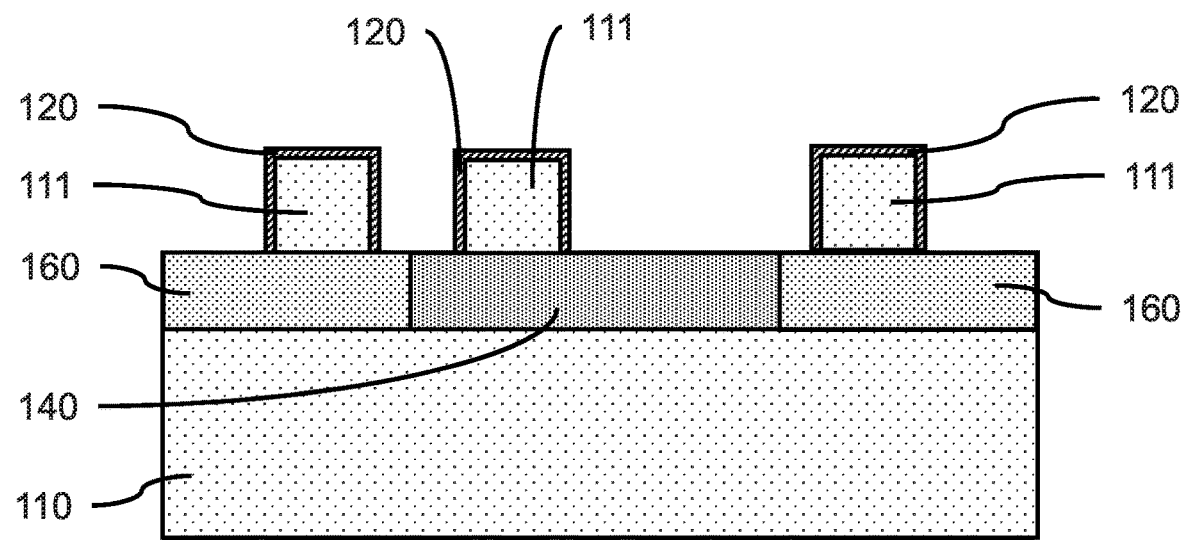
FIG. 16 is a cross-sectional side view of the A-A section of FIG. 15 showing a first set of covered vertical fins on the first bottom source/drain region and a second set of covered vertical fins on the second bottom source/drain regions, in accordance with an embodiment of the present invention.

FIG. 16 is a cross-sectional side view of the A-A section of FIG. 15 showing a first set of covered vertical fins on the first bottom source/drain region and a second set of covered vertical fins on the second bottom source/drain regions, in accordance with an embodiment of the present invention.

In various embodiments, the first bottom source/drain region 140 can be between two second bottom source/drain regions 160, where a first set of covered vertical fins can be on the first bottom source/drain region 140 and a second set of vertical fins can be on the second bottom source/drain regions 160.

Figure 17:
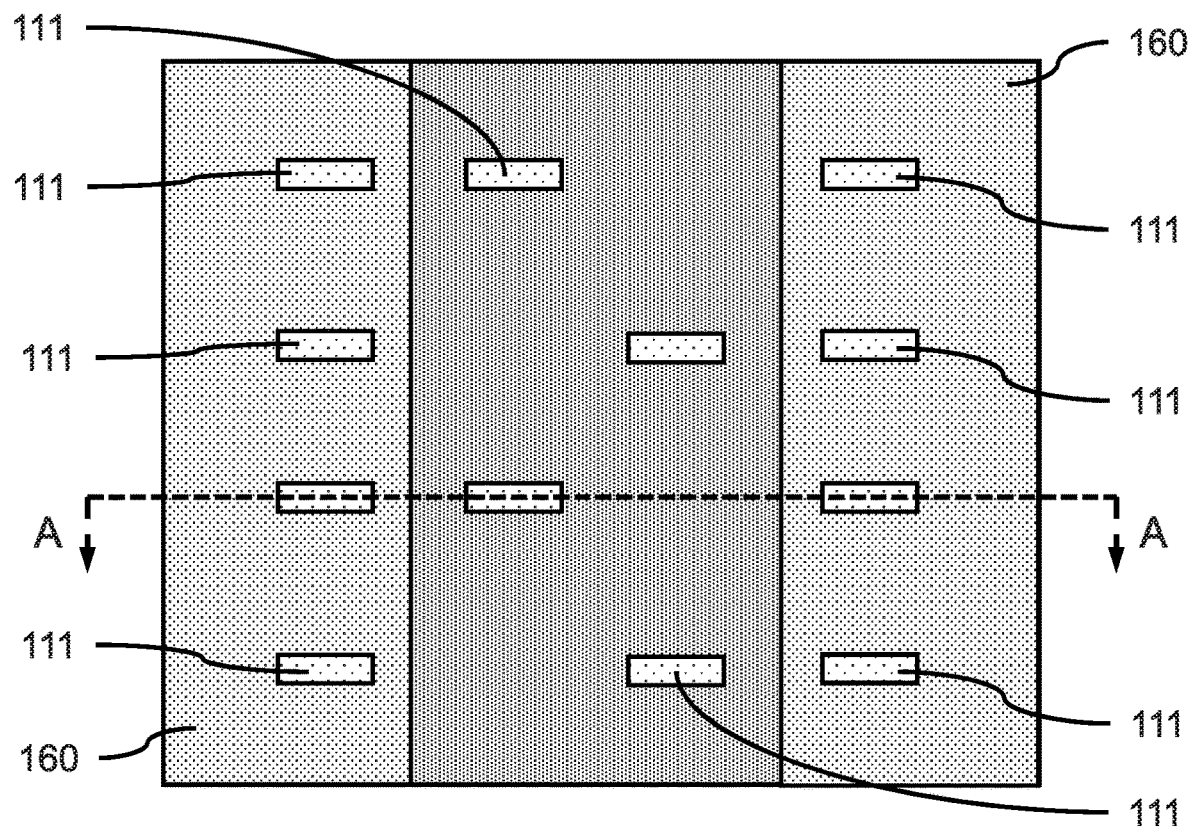
FIG. 17 is a top view showing the exposed vertical fins on the first bottom source/drain region and the second bottom source/drain regions, in accordance with an embodiment of the present invention.

FIG. 17 is a top view showing the exposed vertical fins on the first bottom source/drain region and the second bottom source/drain regions, in accordance with an embodiment of the present invention.

In one or more embodiments, the cover layer 120 can be removed from the vertical fins 111 using a selective etch, for example, an isotropic wet or dry etch (e.g., wet chemical etch, dry plasma etch), a directional etch (e.g., a reactive ion etch (RIE), or a combination thereof. Removal of the cover layer 120 can expose the underlying vertical fins 111.

Figure 18:
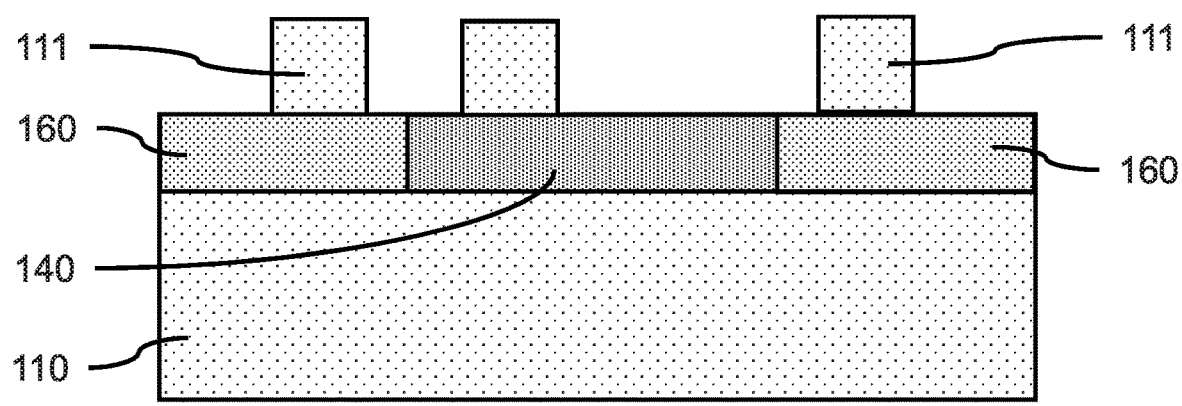
FIG. 18 is a cross-sectional side view of the A-A section of FIG. 17 showing the exposed vertical fins on the first bottom source/drain region and the second bottom source/drain regions, in accordance with an embodiment of the present invention.

FIG. 18 is a cross-sectional side view of the A-A section of FIG. 17 showing the exposed vertical fins on the first bottom source/drain region and the second bottom source/drain regions, in accordance with an embodiment of the present invention.

The exposed vertical fins 111 can be arranged on the first bottom source/drain region 140 and the second bottom source/drain regions 160 to form one or more SRAM cells.

Figure 19:
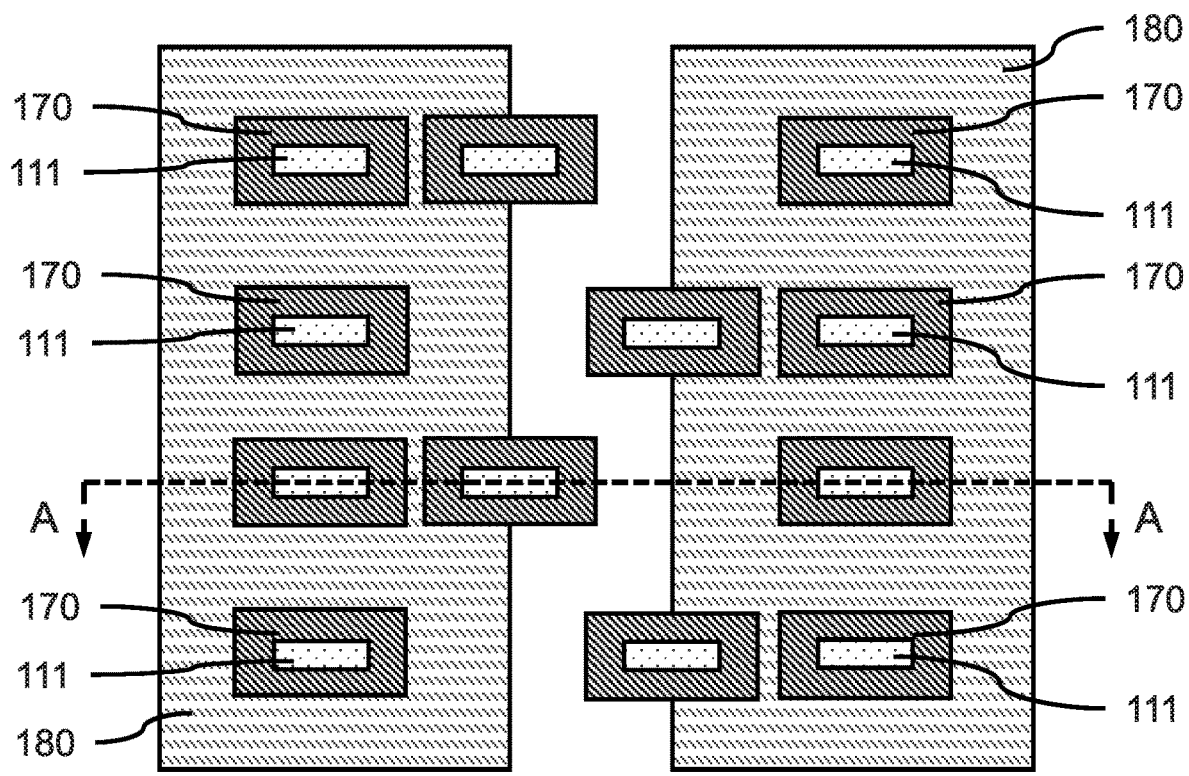
FIG. 19 is a cross-sectional top view showing the arrangement of vertical fins covered by a spacer layer, and a protective layer, in accordance with an embodiment of the present invention.

FIG. 19 is a cross-sectional top view showing the arrangement of vertical fins covered by a spacer layer, and a protective layer, in accordance with an embodiment of the present invention.

In one or more embodiments, a spacer layer can be formed on the plurality of vertical fins 111, where the spacer layer can be formed by a conformal deposition (e.g., atomic layer deposition (ALD), plasma enhanced ALD (PEALD), chemical vapor deposition (CVD), plasma enhanced CVD (PECVD), or a combination thereof. The spacer layer can be formed on the top surface, sidewalls, and end walls of each vertical fin 111. The thickness of the spacer layer on the surfaces of the vertical fins 111 can be controlled to form a layer sufficiently thick to define a self-aligned boundary around each vertical fin 111 during a subsequent etching processes. In various embodiments, a portion of the spacer layer can be removed from the surface of the substrate 110 by etching to form a spacer 170 on each of the vertical fins 111, and expose the substrate surface outside the boundary of each spacer 170. The spacers 170 can shield an area surrounding each of the vertical fins 111. A gap can be between the spacers 170 on adjacent vertical fins. The thickness of the spacers 170 can be based on the distance from the vertical fins 111 to be shielded.

The spacer layer and spacers 170 can be any suitable material, including but not limited to a dielectric oxide (e.g., silicon oxide (SiO), carbon-doped silicon oxide (SiO:C)), or a dielectric nitride (e.g., silicon nitride (SiN), silicon boronitride (SiBN), silicon borocarbonitride (SiBCN), silicon oxyboronitride (SiOBN), silicon oxycarbonitride (SiOCN)), or combinations thereof.

In one or more embodiments, a protective layer 180 can be formed on a portion of the spacers 170 and vertical fins 111, where the protective layer 180 can be formed by a blanket deposition. The protective layer 180 can be masked an patterned using lithographic techniques to expose a portion of each of the spacer covered vertical fins 111 on the first source/drain region. The portion of the protective layer 180 removed can be a strip perpendicular to the long axis of the vertical fins 111. The portion of the protective layer 180 can be removed using a selective etch.

Portions of the spacers 170 on the vertical fins 111 forming the staggered pattern can protrude from the sides into the opening formed by removing the strip of the protective layer 180. The protruding portions of the spacers 170 and vertical fins 111 can form a curving path between the remaining portions of the protective layer 180 and around the protruding portions of the spacers 170. The width of the path can vary depending on the pitch and spacing between the vertical fins. The end walls of the spacers 170 on one side of the opening can extend past the end walls of the spacers 170 on the opposite side of the opening.

Figure 20:
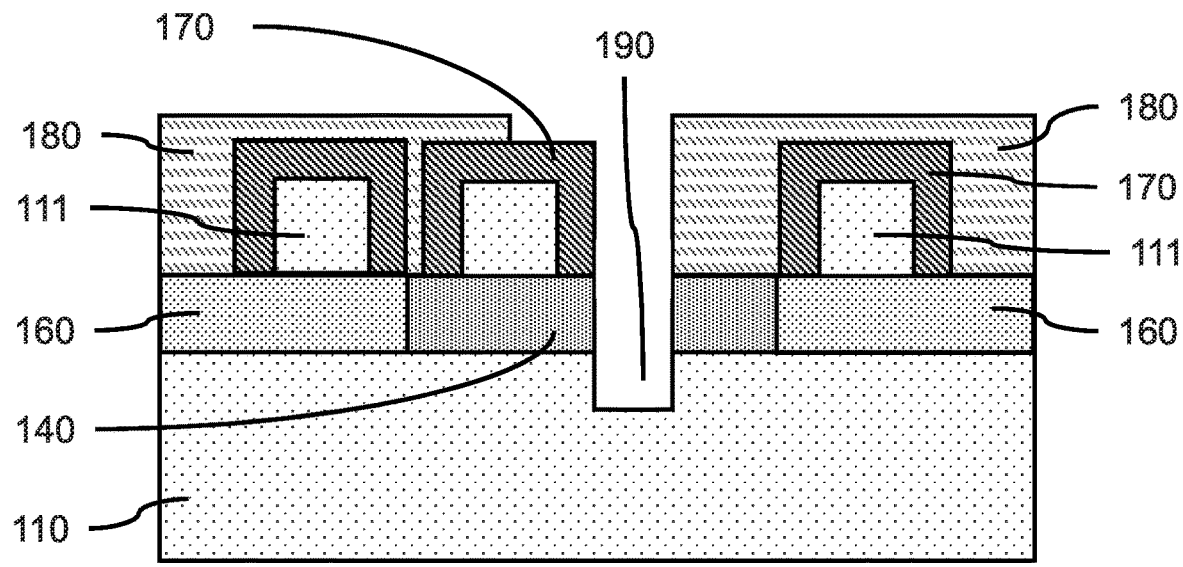
FIG. 20 is a cross-sectional side view of the A-A section showing vertical fins covered by spacers and a protective layer with an exposed portion of the first bottom source/drain region removed to form an isolation region trench, in accordance with an embodiment of the present invention.

FIG. 20 is a cross-sectional side view of the A-A section showing vertical fins covered by spacers and a protective layer with an exposed portion of the first bottom source/drain region removed to form an isolation region trench, in accordance with an embodiment of the present invention.

In one or more embodiments, the protective layer 180 can cover at least a portion of the spacer layer 170 and vertical fins 111 on the first source/drain region 140 and the spacer layer 170 and vertical fins 111 on the second source/drain region 160. A portion of the first bottom source/drain region 140 can be exposed between the portions of the spacers 170 and sidewalls of the protective layer 180. The protective layer 180 can be formed by a blanket deposition and patterned using lithographic techniques and etching.

In one or more embodiments, the protective layer 180 can be a soft mask material, for example, a lithography resist material, such as a polymeric material (e.g. poly(methyl methacrylate) (PMMA), siloxanes, polydimethylsiloxane (PDMS), hydrogen silsesquioxane (HSQ), tetraethyl orthosilicate (TEOS), etc.) or amorphous carbon (a-C).

In various embodiments, the protective layer 180 can be hardmask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. The protective layer 180 can also be a combination of a hardmask and soft mask. The material of the protective layer 180 can be different from the material of the spacers 170.

In one or more embodiments, an exposed portion of the first bottom source/drain region 140 can be removed to form an isolation region trench 190, where the exposed portion of the first bottom source/drain region 140 can be removed using a selective, directional etch (e.g., reactive ion etch (RIE)). The isolation region trench 190 can follow the curving path between the remaining portions of the protective layer 180 and spacers 170 to form separate first bottom source/drain regions on opposite sides of the isolation region trench 190.

Figure 21:
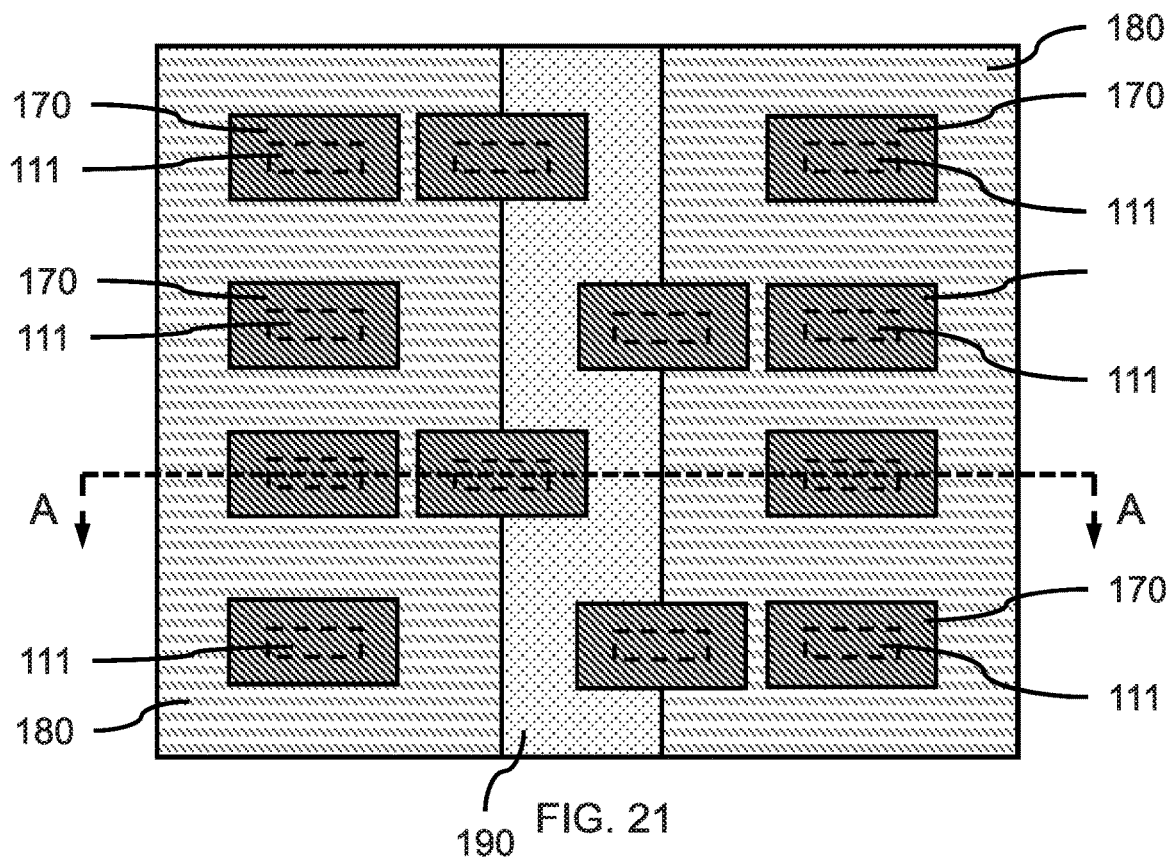
FIG. 21 is a top view showing an isolation region fill formed in the isolation region trench, in accordance with an embodiment of the present invention.

FIG. 21 is a top view showing an isolation region fill formed in the isolation region trench, in accordance with an embodiment of the present invention.

In one or more embodiments, the isolation region trench 190 can be filled with an insulating, dielectric material, including, but not limited to, silicon oxide (SiO), silicon nitride (SiN), a low-k dielectric material, or combinations thereof. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof, to form an isolation region fill 195.

The isolation region fill 195 can be etched back to be at approximately the same height as the substrate 110, first bottom source/drain region 140, and second bottom source/drain region 160.

Figure 22:
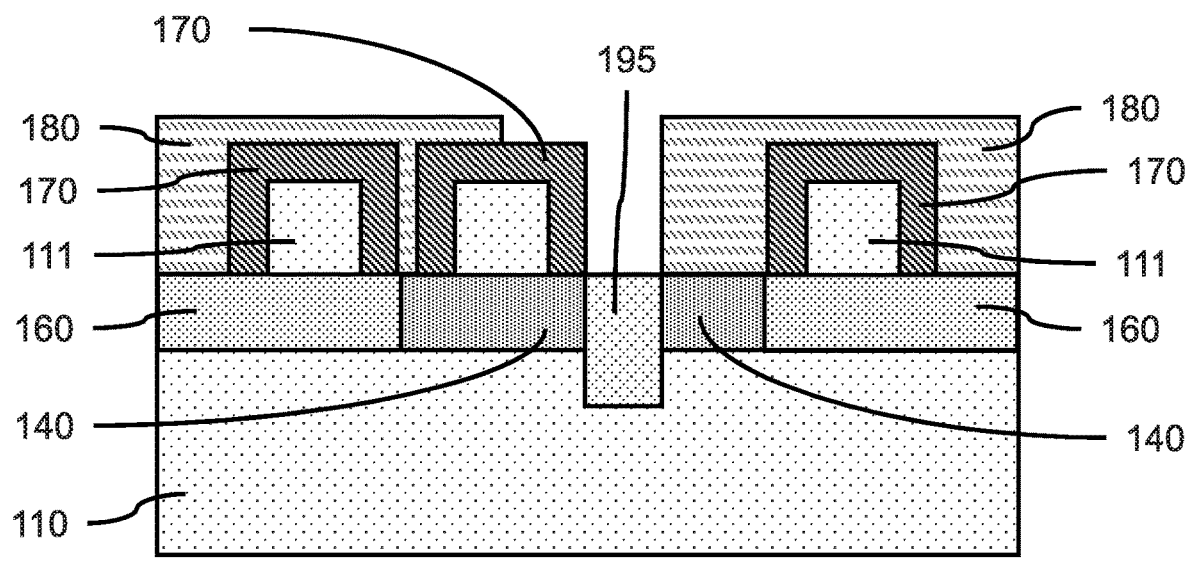
FIG. 22 is a cross-sectional side view of the A-A section of FIG. 21 showing an exposed portion of the first bottom source/drain region removed to form an isolation region trench, and an isolation region fill formed in the trench, in accordance with an embodiment of the present invention.

FIG. 22 is a cross-sectional side view of the A-A section of FIG. 21 showing an exposed portion of the first bottom source/drain region removed to form an isolation region trench, and an isolation region fill formed in the trench, in accordance with an embodiment of the present invention.

The protective layer 180 can be over the second bottom source/drain regions 160 and the spacers 170 and vertical fins on the second bottom source/drain regions. The protective layer 180 can also cover a portion of the first bottom source/drain region 140 and a portion of each spacer on the vertical fins 111 on the first bottom source/drain region 140. The protective layer 180 can fill in the gap between the spacers 170 on adjacent spacers. A portion of the spacers 170 on the first bottom source/drain region 140 can be exposed. The width of the sidewalls of the spacers 170 can define an offset distance from the sidewalls and end walls of the vertical fins 111, where the isolation region trench and isolation region fill 195 can be formed.

In one or more embodiments, the isolation region trench 190 can be formed through the first bottom source/drain region 140 and extend into the substrate 110 to electrically separate portions of the first bottom source/drain region 140. The sidewalls of the isolation region fill 195 and adjacent portions of the first bottom source/drain region 140 can be self-aligned to the vertical fins 111 on the first bottom source/drain region 140 using the spacers 170 to define the removed portions of the first bottom source/drain region.

In various embodiments, the portion of the first bottom source/drain region 140 protruding into the isolation region fill 195 can have a width perpendicular to the long axis of the vertical fin 111 in the range of about 20 nm to about 100 nm, or in the range of about 30 nm to about 60 nm, where the width is defined by the thickness of the spacers 170, although other lengths are also contemplated.

Figure 23:
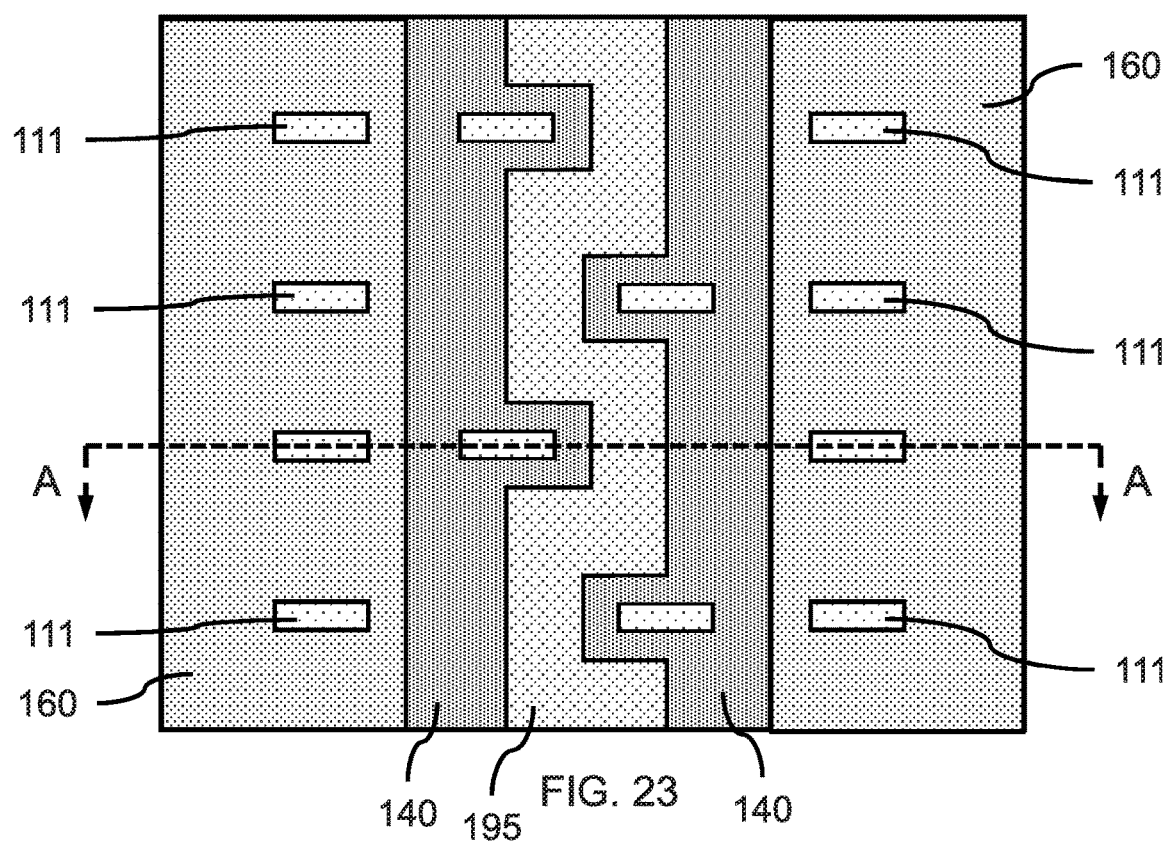
FIG. 23 is a top view showing exposed vertical fins on the first bottom source/drain region separated by an intervening isolation region fill, in accordance with an embodiment of the present invention.

FIG. 23 is a top view showing exposed vertical fins on the first bottom source/drain region separated by an intervening isolation region fill, in accordance with an embodiment of the present invention.

In one or more embodiments, the remaining portions of the protective layer 180 can be removed using a selective etch to expose the underlying spacers 170, first bottom source/drain regions 140, and second bottom source/drain region 160. The spacers 170 can be removed using a selective etch to expose the underlying vertical fins 111.

The vertical fins 111 on the first bottom source/drain region 140 can be offset from the vertical fins 111 on the first bottom source/drain region 140 on the opposite side of the isolation region fill 195, such that the first bottom source/ drain regions 140 on opposite sides can be nested to reduce the overall area of an SRAM cell. An arrangement of six vertical fins can form the vertical transport FinFETs of an SRAM cell, where three (3) vertical fin can be on one side of the isolation region fill 195 and three (3) vertical fin can be on the opposite side of the isolation region fill.

Figure 24:
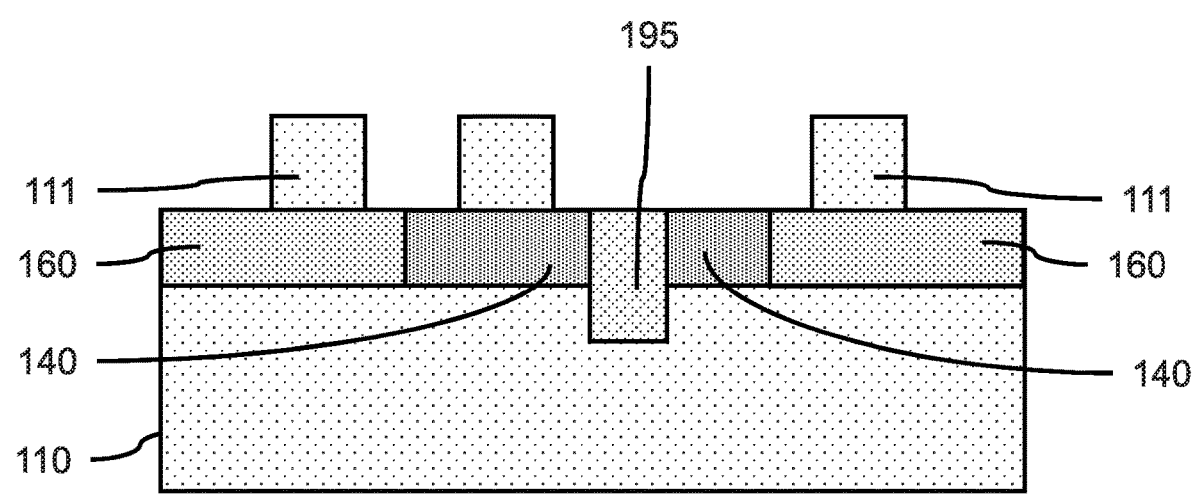
FIG. 24 is a cross-sectional side view of the A-A section of FIG. 23 showing exposed vertical fins on the first bottom source/drain region separated by an intervening isolation region fill, in accordance with an embodiment of the present invention.

FIG. 24 is a cross-sectional side view of the A-A section of FIG. 23 showing exposed vertical fins on the first bottom source/drain region separated by an intervening isolation region fill, in accordance with an embodiment of the present invention.

In one or more embodiments, a plurality of vertical fins 111 can be on the second bottom source/drain region 160, and a plurality of vertical fins 111 can be on the first bottom source/drain regions 140. The vertical fins 111 can be separated by the intervening isolation region fill 195.

Figure 25:
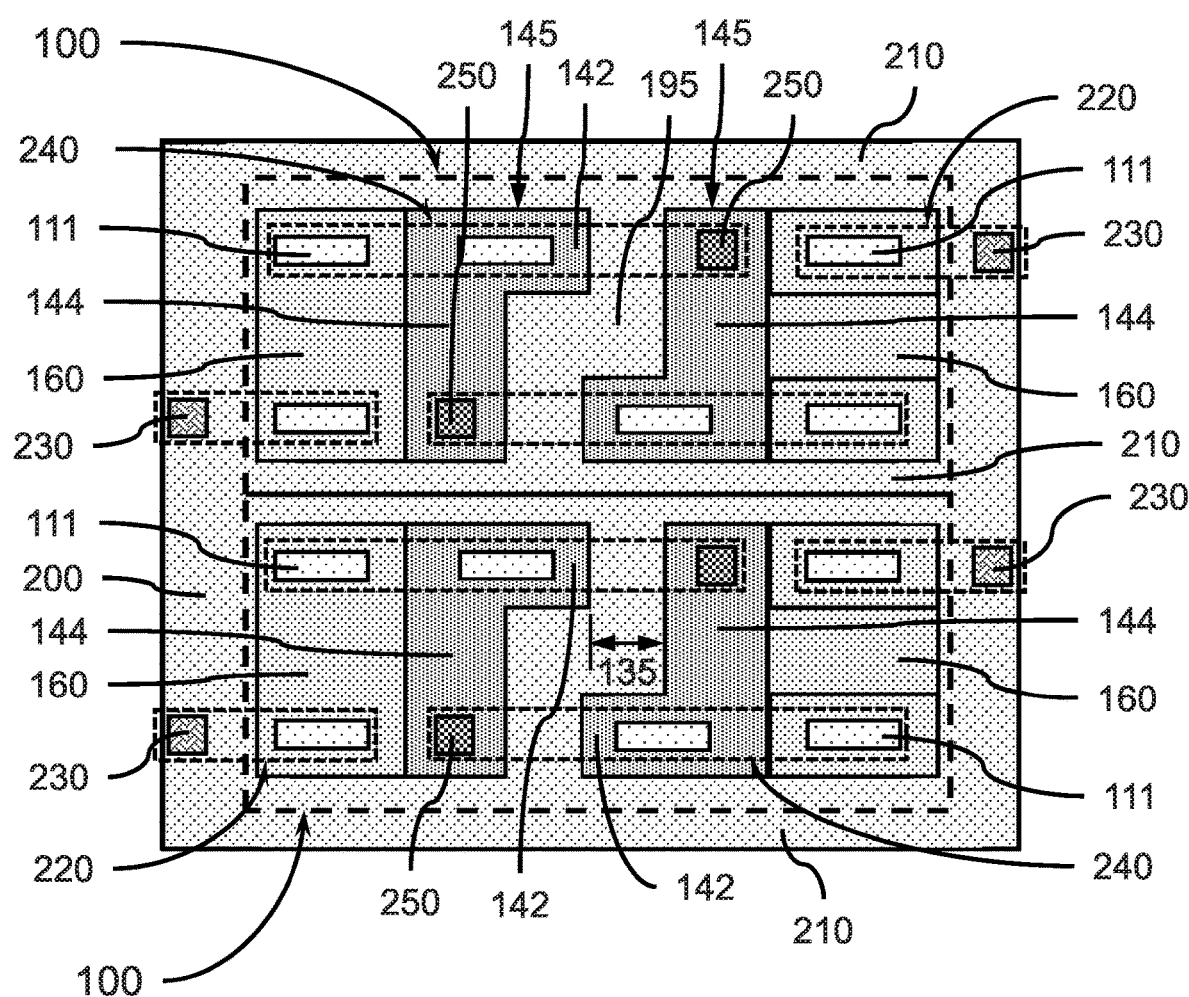
FIG. 25 is a top view showing and arrangement of vertical fins, contact vias, and conductive lines forming a pair of adjacent static random access memory (SRAM) cells, in accordance with an embodiment of the present invention.

FIG. 25 is a top view showing and arrangement of vertical fins, contact vias, and conductive lines forming a pair of adjacent static random access memory (SRAM) cells, in accordance with an embodiment of the present invention.

In one or more embodiments, neighboring SRAM cells 100 can be electrically separated by forming additional longitudinal isolation regions 200 parallel with the isolation region trench 190, and latitudinal isolation regions 210 perpendicular to the isolation region trench 190. The latitudinal longitudinal isolation regions 200 and latitudinal isolation regions 210 can be filled with a dielectric material. Intersection of the latitudinal isolation regions 210 with the isolation region fill 195 and longitudinal isolation regions 200 can electrically isolate neighboring SRAM cells 100.

The arrangement and dimensions of the first bottom source/drain region 140 can form an L-shaped first bottom source/drain 145 below the vertical fin 111, where the vertical fin can form a PU transistor of the SRAM. The base portion 142 of the L-shaped first bottom source/drain 145 can extend beyond the edge of the adjoining leg portion 144 by a distance in the range of about 5 nm to about 150 nm, or in the range of about 10 nm to about 100 nm, although other lengths are also contemplated. The extending portion of the bottom source/drain 140 can provide the base portion 142 of the L-shaped bottom source/drain 145.

In various embodiments, the base portion 142 of the L-shaped first bottom source/drain 145 can have a length parallel with the long axis of the vertical fins 111 in the range of about 40 nm to about 200 nm, or in the range of about 60 nm to about 120 nm, although other lengths are also contemplated. The base portion 142 of the L-shaped first bottom source/drain 145 can have a width perpendicular to the long axis of the vertical fin 111 in the range of about 20 nm to about 100 nm, or in the range of about 30 nm to about 60 nm, although other widths are also contemplated. The base portion of the L-shaped bottom source/drain 145 can have a greater length than width.

In one or more embodiments, a complementary second bottom source/drain region 160 can be abutting the first bottom source/drain region 140, where the adjoining complementary second bottom source/drain region 160 can be a rectangular second bottom source/drain region 160. The second bottom source/drain region 160 can include the opposite type of dopant from the adjoining first bottom source/drain 145.

In various embodiments, the second bottom source/drain region 160 can have a width perpendicular to the long axis of the vertical fin 111 in the range of about 15 nm to about 400 nm, or in the range of about 25 nm to about 200 nm, although other lengths are also contemplated.

In various embodiments, the second bottom source/drain region 160 can have a length parallel with the long axis of the vertical fin 111 in the range of about 20 nm to about 100 nm, or in the range of about 30 nm to about 60 nm, although other lengths are also contemplated.

In various embodiments, the bottom source/drain regions 140, 160 can be separated from neighboring adjoining bottom source/drain regions 140, 160 by a gap 135 having a width in the range of about 10 nm to about 100 nm, or in the range of about 15 nm to about 50 nm, although other lengths are also contemplated.

In various embodiments, the area occupied by the PU, PD, and PG transistors of the SRAM cell 100 including the nested L-shaped first bottom source/drains 145 and second bottom source/drain regions 160 can occupy an area of about 5% to about 25% less or about 10% to about 20% less than a SRAM cell 100 without the nested L-shaped bottom source/drains. The nesting of the L-shaped first bottom source/drain regions 140 can allow the pull-up transistors to be moved closer together without electrically shorting or overlapping of different features from lithographic mask shifting, due to the self-aligned nature of the bottom source/drain removal process around the spacers 170.

In one or more embodiments, word lines 220 (dotted lines) can be formed to the gates of the PG transistors, and gate contacts 230 can be formed to the word lines.

In one or more embodiments, one or more bit lines 240 (dotted lines) can be formed to the PU and PD transistors, and to the source/drain contacts 250.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above." "upper." and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A memory cell, comprising:
a first L-shaped bottom source/drain including a first dopant; and
a first adjoining bottom source/drain region abutting the first L-shaped bottom source/drain, wherein the first adjoining bottom source/drain region includes a second dopant that is the opposite type from the first dopant, wherein the first L-shaped bottom source/drain has a leg portion and a base portion that extends laterally away from the first adjoining bottom source/drain region.

2. The memory cell of claim 1, further comprising a vertical fin on the first L-shaped bottom source/drain on portions of the base portion and leg portion of the first L-shaped bottom source/drain, wherein the first adjoining bottom source/drain is rectangular.

3. The memory cell of claim 1, wherein the first dopant is a p-type dopant and the second dopant is an n-type dopant.

4. The memory cell of claim 1, further comprising a second L-shaped bottom source/drain electrically separated from the first L-shaped bottom source/drain by an isolation region fill.

5. The memory cell of claim 4, wherein the second L-shaped bottom source/drain is nested with the first L-shaped bottom source/drain region.

6. The memory cell of claim 5, wherein the memory cell with the nested L-shaped bottom source/drains occupies an area of about 5% to about 25% less than a memory cell without the nested L-shaped bottom source/drains.

7. The memory cell of claim 6, further comprising one vertical fin on the first L-shaped bottom source/drain, and two vertical fins on the first adjoining bottom source/drain region.

8. The memory cell of claim 1, further comprising a second adjoining bottom source/drain region abutting the second L-shaped bottom source/drain.

9. The memory cell of claim 8, further comprising one vertical fin on the second L-shaped bottom source/drain, and two vertical fins on the second adjoining bottom source/drain region.

10. A static random access memory (SRAM) cell, comprising:
   a first L-shaped bottom source/drain including a p-type dopant, wherein the first L-shaped bottom source/drain has a leg portion and a base portion;
   a vertical fin on the first L-shaped bottom source/drain, wherein a portion of the vertical fin is on the base portion and a portion of the vertical fin is on the leg portion of the first L-shaped bottom source/drain;
   a first adjoining bottom source/drain region including an n-type dopant;
   two vertical fins on the first adjoining bottom source/drain region;
   a second L-shaped bottom source/drain region electrically separated from the first L-shaped bottom source/drain region by an isolation region fill; and
   a second adjoining bottom source/drain region abutting the second L-shaped bottom source/drain.

11. The SRAM of claim 10, wherein the vertical fin on the first L-shaped bottom source/drain has a length in a range of about 5 nm to about 150 nm, and a base portion of the first bottom source/drain region has a length parallel with the long axis of the vertical fin in a range of about 15 nm to about 300 nm.

12. The SRAM cell of claim 11, wherein the base portion of the first L-shaped first bottom source/drain has a width perpendicular to the long axis of the vertical fin in a range of about 20 nm to about 100 nm.

13. The SRAM cell of claim 12, wherein the vertical fin on the first L-shaped bottom source/drain is part of a vertical transport p-doped fin field effect transistor.

14. The SRAM cell of claim 12, wherein the two vertical fins on the first adjoining bottom source/drain region are vertical transport n-doped fin field effect transistors.

* * * * *